SEMICONDUCTOR BULK EFFECT MICROWAVE OSCILLATOR

Filed July 19, 1965

INVENTOR.
NORMAN BRASLAU

BY John E. [signature]

ATTORNEY

United States Patent Office 3,435,303

Patented Mar. 25, 1969

3,435,303

SEMICONDUCTOR BULK EFFECT MICROWAVE OSCILLATOR

Norman Braslau, Katonah, N.Y., assignor to International Business Machines Corporation, Armonk, N.Y., a corporation of New York Filed July 19, 1965, Ser. No. 473,015
Int. Cl. H01l 3/00, 5/00
U.S. Cl. 317—234 3 Claims

ABSTRACT OF THE DISCLOSURE

The oscillator employs a crystal of single conductivity type gallium arsenide in which the application of an electric field above a given threshold intensity produces an unstable region of high electric field in the body. This high electric field region is produced by the response of the electric charge carriers in the semiconductor body and can be controlled to produce high frequency oscillations. High power microwave outputs are obtained, without breaking down the gallium arsenide at the edges using registered symmetrical contacts on opposite surfaces of the gallium arsenide crystal. Each of these contacts covers only a portion of the surface and does not extend to the edges of the body. The edges of the crystal are cleaved to avoid edge contamination. With this arrangement the high intensity electric field applied by the contacts is a homogeneous field which is more intense in the portion of the gallium arsenide directly between the contacts than at the edges of the crystal.

The present invention relates to solid state semiconductor devices which depend for their operation on the bulk phenomenon which has come to be known as the "Gunn Effect" and more particularly, to improved bulk devices of this type as well as the method by which they are made.

The term "Gunn Effect" has been applied to the discovery that the application of an electric field in excess of a threshold field produces in certain semiconductor materials a moving region of very high electric field, which is termed an electric shock wave. This phenomenon is a bulk effect in that it is produced as the result of the response of the bulk charge carriers in the semiconductor material to the applied field. In this respect devices using this effect differ from conventional semiconductor diodes and transistors which depend for their operation on the existence of a junction in the material. A description of this effect as well as of a number of devices using the effect may be found in copending application Ser. No. 374,758, filed June 12, 1964 in behalf of J. B. Gunn now Patent No. 3,365,583, issued Jan. 23, 1968. Though the effect can be used in a number of different types of devices, the principle use thus far proposed has been that of a microwave oscillator. Though the present invention may be applied not only to oscillators but to other devices employing this effect, the description herein is primarily directed to microwave oscillators by way of illustration.

Although oscillators have been fabricated which are capable of being run on continuous as well as on a pulsed basis and which are capable of handling power inputs of 1 or 2 watts, problems have arisen in attempting to reproducibly produce such devices and, further, there has been a tendency in many of the devices produced, to fail or break down if subjected to a voltage barely above the threshold voltage. It had been felt up to the time of this invention, that such failures were due to heating of the semiconducor material; however, close observation of devices which have failed, indicate the presence of conducting channels at the surfaces of the semiconductor material between the electrodes. It has been found that by proper design of the structure of the oscillator as well as by an improved method of fabricating devices in accordance with the design, it is possible to produce oscillators which break down only at voltages several times the threshold voltages, which have reproducible characteristics, and which successfully handle input power levels of greater than 5 watts. The oscillator itself, in its basic form, usually employs a thin flat slab of semiconductor material which, for example, may be a GaAs crystal about 30 microns in thickness, and having a resistivity of some 1 to 10 ohms per centimeter. Ohmic contacts are made to the opposite faces of the crystal and these contacts are connected to the power supply for generating the necessary electric field. In the past, these ohmic contacts have covered the entire areas of the opposing surfaces of a crystal with sawed sides. It is in this type of a device that surface breakdown failures have been encountered. In accordance with the principles of the present invention, these failures are minimized by fabricating the device so that the ohmic contacts do not extend to the edges of the semiconductor crystal, and therefore, the electrical path length from any portion of one ohmic contact to the other ohmic contact along the surface of the material is much longer than the electrical path length directly through the material. Further, care is taken in the preparation of the devices to avoid contamination of the surface as well as the edges of the semiconductor material and to reduce the surface irregularities due to sawing which decreases surface resistance.

A preferred contaminant-free method of fabricating reproducible devices which do not fail because of surface effects and which have reproducible characteristics, is one in which the material for the ohmic contacts is vacuum deposited through a mask on both surfaces of a large crystal. The mask defines discrete separated areas on which the material is deposited and by proper registration during the deposition these discrete areas on the opposite surfaces are registered with each other. After the material is deposited in this way, the device is subjected to heat to produce alloying and the desired ohmic connection between the semiconductor crystal and the discrete areas of conductor material on both sides of the device. Thereafter, the semiconductor crystal is scribed in such a way as to separate the ohmic contacts one from the other and subjected to a force to produce cleaving of the crystal along the scribed lines. In this way, a plurality of devices are realized each having a pair of ohmic contacts on opposite surfaces thereof with each ohmic contact covering an area appreciably less than the entire surface to which it is connected. The entire method is contaminant free and since the individual devices are cleaved, the edges correspond to crystalline planes and are therefore very smooth. It is also possible, by proper orientation of the crystal to have the cleaving take place along a single crystalline plane.

Therefore, it is an object of the present invention to provide improved semiconductor bulk effect devices.

It is a more specific object of the invention to provide improved devices of this type wherein electric shock waves are produced in a body of semiconductor material in response to an electric field applied through two ohmic connections made to semiconductor body.

It is a further object of this invention to provide improved relatively inexpensive microwave oscillator devices.

A further object of this invention is to provide microwave oscillator devices capable of being operated continuously at high input power levels and at voltages several times the threshold voltage.

It is a further object of this invention to provide an improved method of fabricating such devices.

The foregoing and other objects, features and advantages of the invention will be apparent from the following more particular description of preferred embodiments of the invention, as illustrated in the accompanying drawings.

Figure 1:
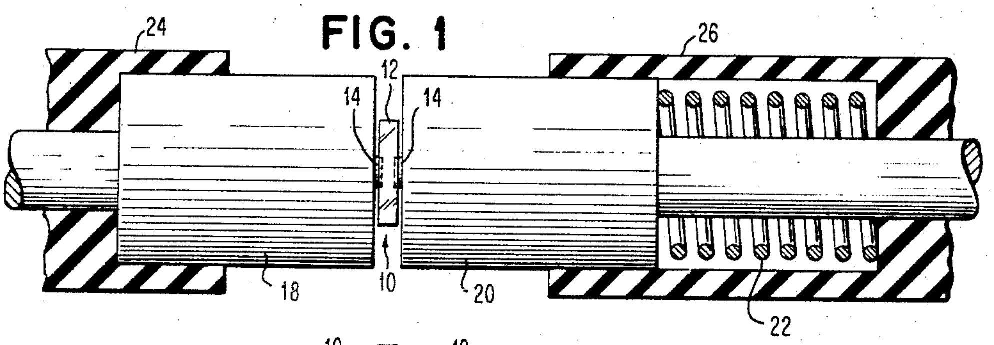
FIG. 1 is a schematic representation of a bulk semiconductor device constructed in accordance with the principles of the present invention.

Referring now to FIG. 1, there is shown a microwave oscillator constructed according to the principles of the present invention. The active device that produces the oscillation is designated 10 and is formed of a body of gallium arsenide having a pair of ohmic contacts 14 on opposite faces thereof. Electrical connections to the ohmic contacts 14 are made through metallic rods 18 and 20. These rods are maintained in pressure contact with the ohmic contacts by a spring 22. Rod 18 is secured in a mounting 24 and rod 20 in a mounting 26 against which spring 20 bears. Electrical connections, not shown, are provided from the rods 18 and 20 to allow the device to be used in circuit applications.

Figure 2A:
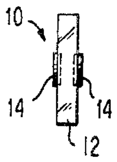
FIGS. 2A and 2B are views of the semiconductor crystal with the ohmic connections on opposite surfaces of the crystal which forms the active element of the device of FIG. 1.
Figure 2B:
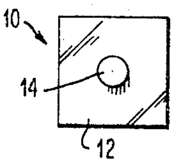

As can be seen in FIG. 1, and in more detail in FIGS. 2A and 2B, the ohmic contacts 14 do not cover the entire surface of the GaAs crystal. With this type of arrangement, it is clear that the electrical path from one ohmic contact to the other ohmic contact is appreciably shorter through the material of the crystal than around the edges of the material. With this type of an arrangement, it has been found that improved microwave oscillator devices can be made with reproducible characteristics.

The microwave oscillator device of the type shown in FIG. 1 depends for its operation on a bulk effect produced in the material by the application of an electric field. As is explained in more detail in the above cited Patent No. 3,365,583, oscillations are produced when there is applied to the GaAs crystal from a power source connected to the ohmic contacts a voltage sufficient to produce an electric field above a threshold field for the device. When this field is exceeded, an electrical shock wave originates in the device in the portion of the GaAs crystal adjacent the ohmic contact which is connected to the negative terminal of the power supply. This shock wave propagates to the other ohmic contact, and another wave is then originated and traverses the material in the same way. Though it has been possible in the past to construct such devices which could be operated continuously without breaking down, it has been extremely difficult to make these types of devices reproducibly. Further, even devices capable of continuous operation were susceptible to breakdown if the input voltage was raised.

It had been believed that these failures were due primarily to heating of the semiconductor material. Though it is still true that heating is a limiting factor in the operations of these devices, heating problems are reduced by using pressure contacts in the form of the copper rods 18 and 20 shown in FIG. 1, which serve as heat sinks to convey the heat from the crystalline GaAs material and by the presence of the passive volume of the device 10, which is in intimate thermal contact with the active area between the contacts. However, it has been observed that breakdown was not always due to heating but in many cases, to a failure along the surface of the device. Such surface breakdown can be caused by impurities or irregularities at the edge of the device and since in the devices previously fabricated the ohmic contacts extended to the edge a very short breakdown path exceeded along the edges of the device.

It has been found that when devices are fabricated to have the geometry shown in FIGS. 1, 2A and 2B wherein the ohmic contacts cover only a small portion of the surface of GaAs it is possible to reproducibly produce large numbers of devices capable of continuous operation without breaking down. These devices are not as susceptible to breakdown due to the application of voltage higher than necessary to exceed the threshold field. This is due to the fact that with this type of geometry, the electrical path along the surface of the device and around the edges is much longer than the electrical path directly through the GaAs material. Further, the devices are prepared to minimize the possibility of there being contaminants or irregularities present on the surface or edges which contribute to surface failure.

Figure 3:
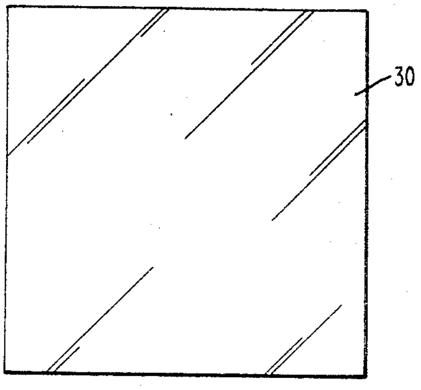
FIG. 3 is a representation of a crystal from which devices are fabricated in accordance with the method of the present invention.
Figure 4:
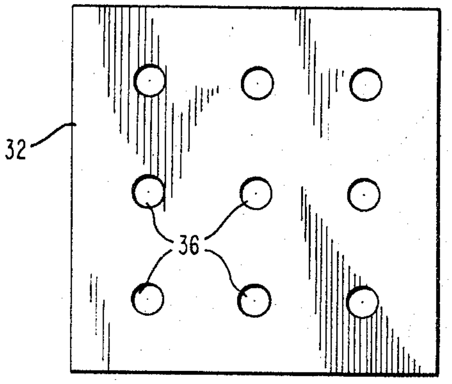
FIG. 4 is showing of a mask used in the practice of this method.
Figure 5:
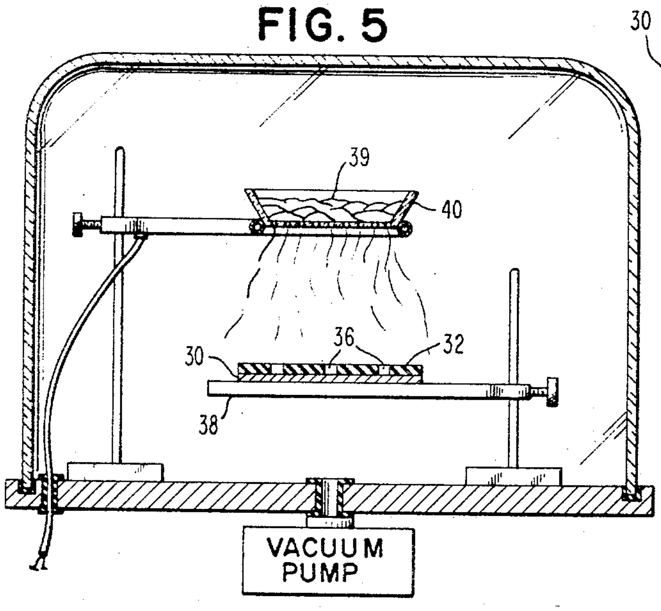
FIG. 5 is a schematic representation of a vacuum system used in depositing the ohmic contact material on the crystal in the preparation of devices in accordance with the principles of the present invention.

It has been found that the method described below with references to FIGS. 3 through 6, is particularly suitable for reproducibly providing improved bulk effect devices. It is believed that this is due to the fact that in this method no contaminants are brought into contact with the surface of the GaAs, and further, the crystals are prepared to avoid the presence of surface and edge irregularities. According to this method, a crystal of GaAs such as that shown at 30 in FIG. 3 is polished using conventional techniques. It is preferable, though not necessary, that the crystal be prepared so that the crystalline planes of the crystal along which cleaving can occur are oriented at right angles to the surfaces of the crystal. There is also prepared using conventional techniques a mask 32 shown in FIG. 4. This mask has a plurality of spaced apertures 36. The crystal 30 and mask 32 with apertures 36 are arranged one above the other on a support 38 within a vacuum system shown schematically in FIG. 5. The source material 39 to be evaporated, which is a mixture of gold, germanium and nickel, is placed in a graphite boat 40. Evaporation is carried out in a conventional manner with the boat 40 being heated to vaporize the source material and thereby deposit on the surface of the GaAs crystal circular contacts formed of an alloy of gold, germanium and nickel. After these contacts are deposited on one surface of the crystal, the crystal 30 and mask 36 are rearranged in the vacuum system with the other surface of the crystal adjacent the mask 32. Registration means not shown are provided so that during this evaporation, the circular contacts evaporated along the second surfaces of the GaAs crystal are in registration with those previously evaporated on the first surface.

Figure 6:
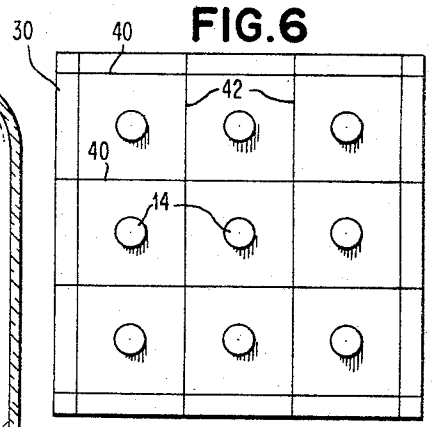
FIG. 6 is an illustration of the manner in which a crystal on which ohmic connections have been made is scribed prior to separating the crystal into individual devices.

Upon completion of this operation, the crystal 30 now having a plurality of circular contacts on both surfaces thereof, is removed from the vacuum and then placed in the same or a similar vacuum system suspended by its edges in an arcuate boat so that the surfaces of the crystal are not in contact with the boat. Heat is then applied to cause the contacts to alloy with the GaAs crystal so that ohmic connections between the crystalline material and the evaporated contacts are completed. After this alloying operation, the crystal with the contacts is removed from the vacuum and, as is shown in FIG. 6, horizontal and vertical indentations are made in the crystal 30 by scribing lines as indicated at 40 and 42. The scribed lines separate the electrical ohmic contacts 14 on the surfaces of the crystal. The crystal which is only some 30 microns in thickness, after it has been scribed is placed in an ultrasonic bath to apply force to the crystal which produces cleaving along the scribed lines. For the embodiment shown in FIG. 6, nine oscillators are provided each with ohmic contacts on both surfaces. The contacts occupy a relatively small portion of the area of the surface and the shortest path between the contacts on the surface of the material is much larger than the path directly through the material itself. The cleaving produced as described above along the scribed lines as a result of subjecting the crystal to the ultrasonic bath produces relatively regular edges, which correspond to natural crystalline planes of the material. Even where the original crystal 30 is not specifically oriented to provide a single crystalline plane for cleavage perpendicular to the face of the crystal, satisfactory devices can be achieved. It has been shown that cleaving does take place through the very thin material even in such an arrangement along crystalline planes.

While the description above has been that of a specific preferred embodiment in which the material used is GaAs, and the devices having the improved characteristics are provided by the vacuum evaporation method described with references to FIGS. 3 through 6, it should be clearly understood that materials other than GaAs such as, for example, indium phosphide, which also exhibits the "Gunn Effect," may be utilized. Similarly, although the embodiment herein disclosed employs metallic rods maintained in pressure contact with the ohmic connections on the semiconductor crystal since this structure has been used to advantage in practicing the invention, the invention in its broadest scope is not limited to this combination. For example, solder connections may be made between the metallic rods and the ohmic connections on the improved basic electric shock wave device fabricated in accordance with the principles of the invention. It should be further pointed out that though the specific embodiment described above is a microwave oscillator, electrical shock wave devices using the "Gunn Effect" phenomenon have a variety of other applications, a number of which are described in Patent No. 3,365,583, described above. The improved structure shown in FIGS. 1, 2A and 2B as well as the method described with reference to FIGS. 3 through 6, may also be used to provide for these applications.

While the invention has been particularly shown and described with reference to preferred embodiments thereof, it will be understood by those skilled in the art that various changes in form and details may be made therein without departing from the spirit and scope of the invention.

What is claimed is:

1. A semiconductor bulk effect microwave oscillator comprising:

(a) a body of semiconductor material of one conductivity type in which an unstable region of high electric field is produced by a bulk response of electric charge carriers to the application of an electric field above a threshold value to the body;

(b) first and second ohmic contacts connected on first and second opposite faces of said body for applying a voltage to said body between said contacts;

(c) each of said first and second contacts covering only a portion of the one of said first and second surfaces on which it is connected, neither of said contacts extending to the edges of said surface, and said contacts having the same configuration and being registered with each other so that when a voltage is applied between said contacts a homogeneous electric field is produced in said semiconductor body which is appreciably higher within said body directly between said contacts than at the edges of said body;

(d) and means connected to said contacts for applying a voltage to said contacts to cause the electric field to exceed said threshold value in the semiconductor material directly between said contacts.

2. The microwave oscillator of claim 1 wherein said means for applying voltage includes first and second pressure contacts each bearing against a corresponding one of said ohmic contacts.

3. The microwave oscillator of claim 1 wherein the edges of said semiconductor body are cleaved edges corresponding to crystalline planes of the semiconductor material.

References Cited

UNITED STATES PATENTS

| | | | |
|---|---|---|---|
| 3,037,180 | 5/1962 | Linz | 317—234 |
| 3,047,781 | 7/1962 | Eannarino | 317—234 |
| 3,154,692 | 10/1964 | Shockley | 317—235 |
| 3,364,399 | 1/1968 | Warner | 317—235 |

OTHER REFERENCES

Proceedings of the IEEE: "S-Band GaAs Gunn Effect Oscillators" by Quist et al., pp. 303, 304, March 1965, 331–107G.

JOHN W. HUCKERT, *Primary Examiner.*

J. D. CRAIG, *Assistant Examiner.*

U.S. Cl. X.R.

331—107